United States Patent
Lameiro et al.

(10) Patent No.: US 7,671,690 B2
(45) Date of Patent: Mar. 2, 2010

(54) METHOD AND SIGNAL CONTROL SYSTEM PROVIDING FAST TRANSITIONS IN AN OSCILLATING SIGNAL

(75) Inventors: Paul A. Lameiro, Santa Rosa, CA (US); Michal B. Krombholz, Santa Rosa, CA (US); Michael S. Foster, Santa Rosa, CA (US); Jeffrey E. Nelson, Santa Rosa, CA (US); Stephen T. Sparks, Santa Rosa, CA (US)

(73) Assignee: Agilent Technolgies, Inc., Santa Clara, CA (US)

( * ) Notice: Subject to any disclaimer, the term of this patent is extended or adjusted under 35 U.S.C. 154(b) by 179 days.

(21) Appl. No.: 11/897,782

(22) Filed: Aug. 31, 2007

(65) Prior Publication Data

US 2009/0058548 A1 Mar. 5, 2009

(51) Int. Cl.
*H03L 1/00* (2006.01)
(52) U.S. Cl. .................. 331/175; 331/1 R; 331/16; 331/177 R; 331/183
(58) Field of Classification Search ............ 331/1 R, 331/16, 175, 177, 183
See application file for complete search history.

(56) References Cited

U.S. PATENT DOCUMENTS

| | | | |
|---|---|---|---|
| 5,661,442 A | 8/1997 | Sparks | |
| 6,476,681 B1 * | 11/2002 | Kirkpatrick | 331/17 |
| 6,812,802 B1 * | 11/2004 | Godambe et al. | 331/183 |
| 7,078,974 B2 | 7/2006 | Matsushita et al. | |
| 7,199,351 B2 | 4/2007 | Toma | |
| 7,271,674 B1 * | 9/2007 | Butenhoff et al. | 331/183 |
| 2008/0100374 A1 * | 5/2008 | Papananos et al. | 327/553 |

* cited by examiner

*Primary Examiner*—Joseph Chang
*Assistant Examiner*—Jeffrey Shin

(57) ABSTRACT

In one embodiment, a signal control system has a signal output and includes: 1) a phase-locked loop (PLL) having a voltage-controlled oscillator (VCO), a phase error detector, an oscillating output coupled to the signal output of the signal control system, and a programmable frequency divider coupled in a feedback path between the oscillating output and the phase error detector; 2) at least one automatic level controller (ALC), coupled to the oscillating output; and 3) a plurality of switchable integrators, including first and second switchable integrators that are respectively coupled between the phase error detector and the VCO, and in the at least one ALC. Each of the switchable integrators is switchable between a narrow bandwidth mode that provides for stable operation of the signal control system, and a wide bandwidth mode that enables fast signal transitions at the signal output.

21 Claims, 4 Drawing Sheets

METHOD AND SIGNAL CONTROL SYSTEM PROVIDING FAST TRANSITIONS IN AN OSCILLATING SIGNAL

BACKGROUND

Signal control systems such as radio frequency (RF) signal control systems often need to generate an oscillating signal. Often, the oscillating signal is generated by means of a phase-locked loop (PLL) having a voltage-controlled oscillator (VCO).

Over time, temperature, noise and other factors may cause the power of an oscillating signal to vary. Or, system requirements such as target power or frequency may change. In either case, the power or frequency of the oscillating signal may be changed by programming a frequency divider of the PLL (to adjust the frequency of the oscillating signal), or by programming one or more automatic level controllers (ALCs) (to adjust the amplitude of the oscillating signal).

Any time the frequency or amplitude of an oscillating signal is changed, both programming and settling delays are incurred.

BRIEF DESCRIPTION OF THE DRAWINGS

Illustrative embodiments of the invention are illustrated in the drawings, in which.

DETAILED DESCRIPTION

Figure 1:
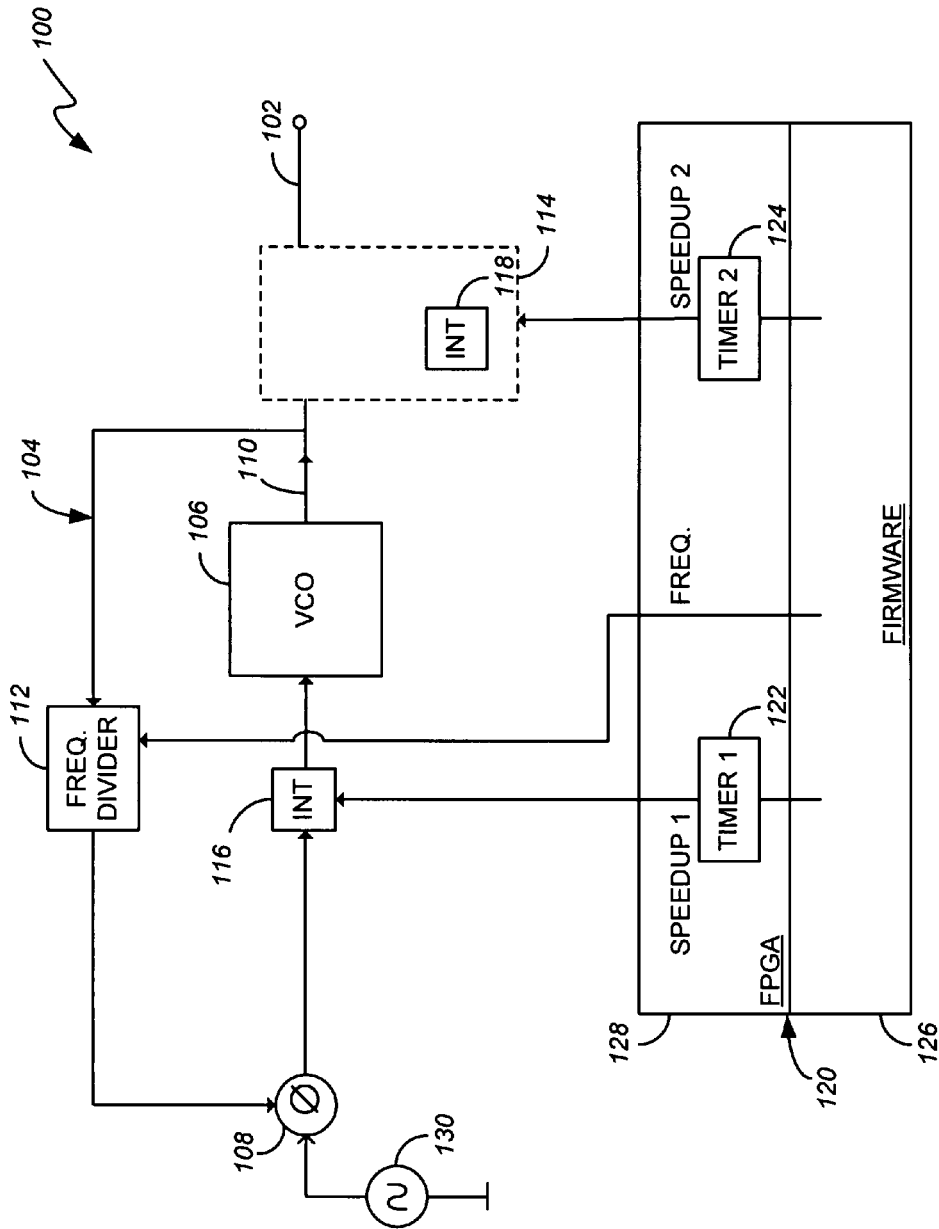
FIGS. 1 & 2 illustrate first and second exemplary signal control systems.

FIG. 1 illustrates an exemplary signal control system 100 having a signal output 102. The signal control system 100 comprises a phase-locked loop (PLL) 104, which in turn comprises a voltage-controlled oscillator (VCO) 106, a phase error detector 108, an oscillating output 110, and a programmable frequency divider 112. The oscillating output 110 is coupled to the signal output 102 of the signal control system 100. The programmable frequency divider 112 is coupled in a feedback path between the oscillating output 110 and the phase error detector 108.

The signal control system 100 further comprises at least one automatic level controller (ALC) 114, each of which is coupled to the oscillating output 110 of the PLL 104.

A plurality of switchable integrators 116, 118 including at least first and second switchable integrators 116, 118, are respectively coupled between the phase error detector 108 and the VCO 106, and in the at least one ALC 114. Each of the switchable integrators 116, 118 is switchable between 1) a narrow bandwidth mode that mitigates phase noise and amplitude noise, and 2) a wide bandwidth mode that enables fast signal transitions of amplitude and frequency at the signal output 102.

In one embodiment, each of the switchable integrators 116, 118 may comprise at least one capacitor that is switchable into and out of the switchable integrator. The capacitor(s) are switched in response to assertions (or de-assertions) of the signals labeled SPEEDUP 1 and SPEEDUP 2. In this manner, each of the switchable integrators may be configured with a first capacitance value in its narrow bandwidth mode, and a second capacitance value in its wide bandwidth mode.

Figure 2:
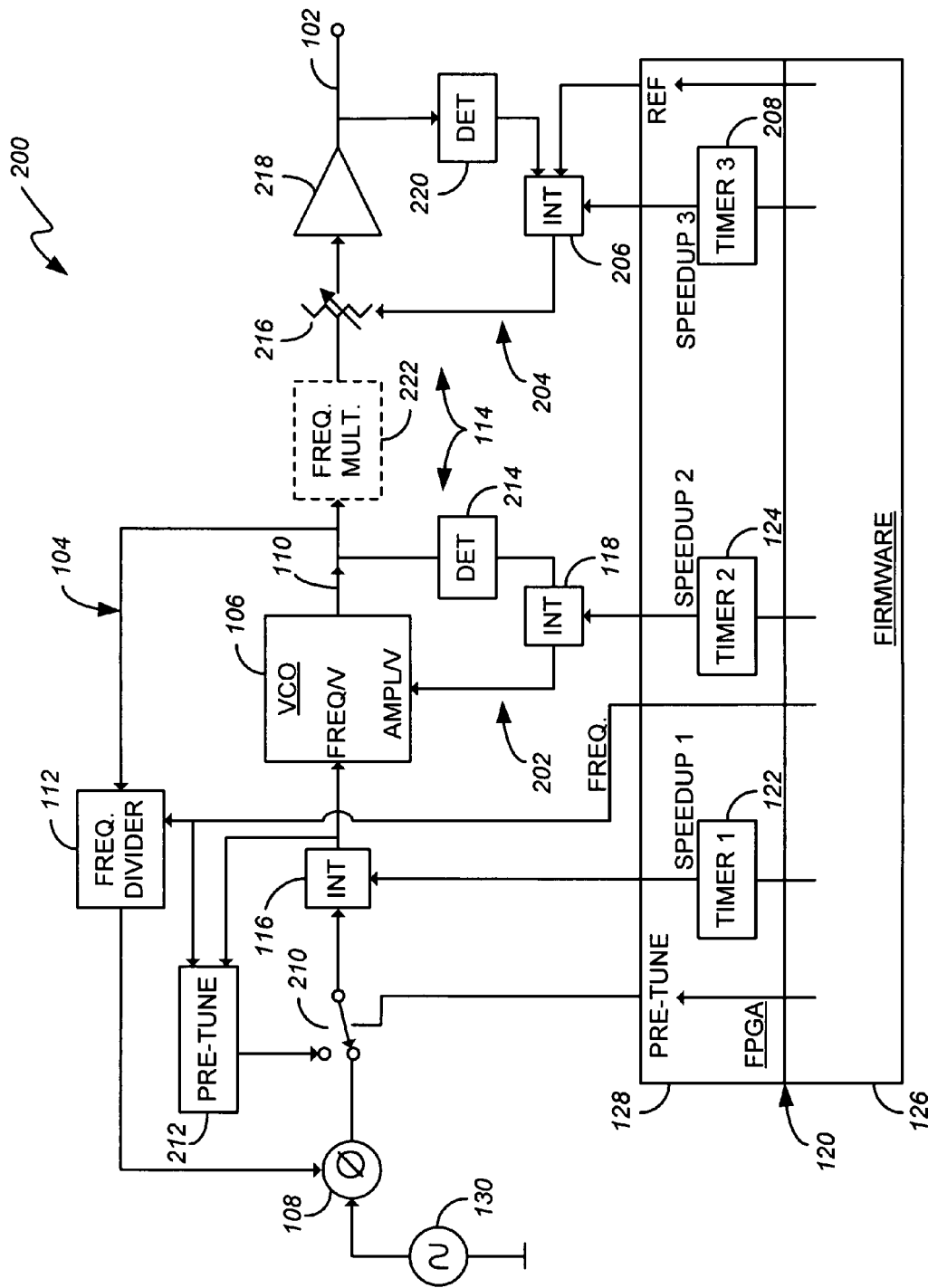

As shown in FIG. 2, and by way of example, the at least one ALC 114 of the signal control system 200 may comprise a first ALC 202, coupled between the oscillating output 110 of the VCO 106 and an amplitude control input (AMPL/V) of the VCO 106. The first ALC 202 may include a switchable integrator (such as the second switchable integrator 118). The at least one ALC 114 may also (or alternatively) comprise a second ALC 204, coupled between the oscillating output 110 of the VCO 106 and the signal output 102 of the signal control system 200. The second ALC 204 may also include a switchable integrator (such as a third switchable integrator 206).

In some embodiments, the signal control system 100 may further comprise a controller 120. The controller 120 may be configured to switch the switchable integrators 116, 118, 206 between their narrow and wide bandwidth modes. In some cases, the controller 120 may comprise a number of timers 122, 124, 208 (e.g., timers 122 and 124 in system 100, and timers 122, 124 and 208 in system 200), and the controller 120 may switch the switchable integrators 116, 118, 206 from their wide to narrow bandwidth modes in response to the number of timers 122, 124, 208. For example, in one embodiment, the controller 120 may be configured to 1) switch the switchable integrators 116, 118, 206 from their narrow bandwidth modes to their wide bandwidth modes in response to an event that indicates a need to change the frequency or power of a signal at the signal output 102, 2) start the number of timers 122, 124, 208, and then 3) respectively switch each of the switchable integrators 116, 118, 206 from its wide to narrow bandwidth mode in response to expiration of a respective one of the number of timers 122, 124, 208.

In some embodiments, the functions of the controller 120 may be implemented by means of firmware 126 and a field-programmable gate array (FPGA) 128, with the timers 122, 124, 208 being implemented by the FPGA 128.

FIG. 2 illustrates a signal control system 200 that builds on the signal control system 100. The same reference numbers are used to indicate corresponding structures in the signal control systems 100, 200 shown in FIGS. 1 & 2.

In FIG. 2, the phase error detector 108 of the PLL 104 receives signals from both the frequency divider 112 and a frequency reference 130. The phase error detector 108 then compares the phases of these input signals and generates a signal that is indicative of an instantaneous phase error. This instantaneous error signal is received by the first switchable integrator 116, which integrates the instantaneous phase error signals output by the phase error detector 108 to produce a signal that is indicative of a cumulative phase error of the PLL 104. The cumulative phase error signal is then provided to a frequency control input (FREQ/V) of the VCO 106, and the VCO 106 either increases or decreases the frequency of its oscillating signal 110, until the output of the phase error detector 108 is such that the output of the first switchable integrator 116 stops changing.

The frequency divider 112 of the PLL 104 receives the oscillating signal 110 output by the VCO 106, and reduces or divides the frequency of the oscillating signal 110. The divisor of the frequency divider 112 is programmed (via a FREQ. control line or lines) so that an intended frequency of the oscillating signal 110, when divided by the divisor, yields a signal having a frequency equivalent to that of the frequency reference 130. In this manner, the VCO's generation of an oscillating signal 110 that has a higher or lower frequency will result in the frequency divider 112 generating a signal having a frequency that is not equivalent to that of the frequency reference 130. The phase error detector 108 will then be forced to generate an error signal, and the VCO 106 will be urged to generate an oscillating signal 110 having a higher or lower frequency. When the VCO 106 generates an oscillating signal 110 of the intended frequency, the PLL 104 enters a steady-state or "phase-locked" mode. The time between 1) programming the frequency divider 112 based on a new "intended frequency" of the oscillating signal 110, and 2) the PLL 104 entering its phase-locked mode, is the "frequency-settling delay" of the PLL 104.

To decrease the frequency-settling delay of the PLL 104, a switch 210 is provided for opening the PLL 104 and coupling the input of the first switchable integrator 116 to a pre-tune circuit 212. The pre-tune circuit 212 serves to rapidly force the output of the first switchable integrator 116 to a predetermined voltage and "pre-tune" the VCO 106 to a desired frequency. In one embodiment, the pre-tune circuit 212 provides a pre-tune voltage to the first switchable integrator 116 based on 1) an indication of a desired frequency (such as a digital voltage provided via the FREQ line), and 2) the voltage output of the first switchable integrator 116. In this manner, the pre-tune circuit 212 provides a voltage output based on a feedback loop that is independent of the feedback provided by the PLL 104.

While the pre-tune circuit 212 is coupled to the input of the first switchable integrator 116, the frequency divider 112 can be programmed with an appropriate value for causing the PLL 104 to lock on the desired frequency. Then, and after the pre-tune circuit 212 has been coupled to the input of the first switchable integrator 116 sufficiently long to move the VCO 106 "close" to the desired frequency, the switch 210 may be toggled to 1) de-couple the pre-tune circuit 212 from the first switchable integrator 116, and 2) close the PLL 104. Frequency-settling then continues via normal operation of the PLL 104.

In some embodiments, the pre-tune circuit 212 and frequency divider 112 may both be programmed by a common FREQ line (as shown in FIG. 2). Alternately, the FREQ line may be replaced by a pair of control lines (or buses) for separately programming the pre-tune circuit 212 and frequency divider 112. In this manner, and by way of example, the pre-tune circuit 212 and frequency divider 112 can be programmed in different ways. Or, for example, the pre-tune circuit 112 could be configured to provide an output corresponding to one of a limited number of frequency ranges, while the frequency divider 112 could be configured in response to a specific and desired frequency.

The signal control system 200 comprises a first ALC 202 that is coupled between the oscillating output 110 of the VCO 106 and an amplitude control input (AMPL/V) of the VCO 106. The first ALC 202 includes an amplitude detector 214 and second switchable integrator 118. In one embodiment, the amplitude detector 214 is programmed such that the oscillating output 110 of the VCO 106 always levels to the same amplitude.

The signal control system 200 also comprises a second ALC 204 that is coupled between the oscillating output 110 of the VCO 106 and the signal output 102 of the signal control system 200. The second ALC 204 includes 1) a linear modulator 216 and amplifier 218 that are coupled in the signal path between the oscillating output 110 of the VCO 106 and the signal output 102 of the signal control system 100, and 2) an amplitude detector 220 and third switchable integrator 206 that are coupled in a feedback path of the second ALC 204. In one embodiment, a digitally generated analog voltage reference, such as a twelve-bit digital voltage that is converted to an analog voltage via a digital-to-analog converter, is provided to the third switchable integrator 206 via the line REF. In this manner, the third switchable integrator 206 serves to compare the digitally generated analog voltage reference to the amplitude detected by amplitude detector 220, and the output of the third switchable integrator 206 provides a signal for correcting the amplitude via the linear modulator 216 as the second ALC 204 levels the output signal 102.

The signal control system 200 may also comprise one or more frequency multipliers 222 that are coupled to the oscillating output 110 of the VCO 106.

Figure 3:
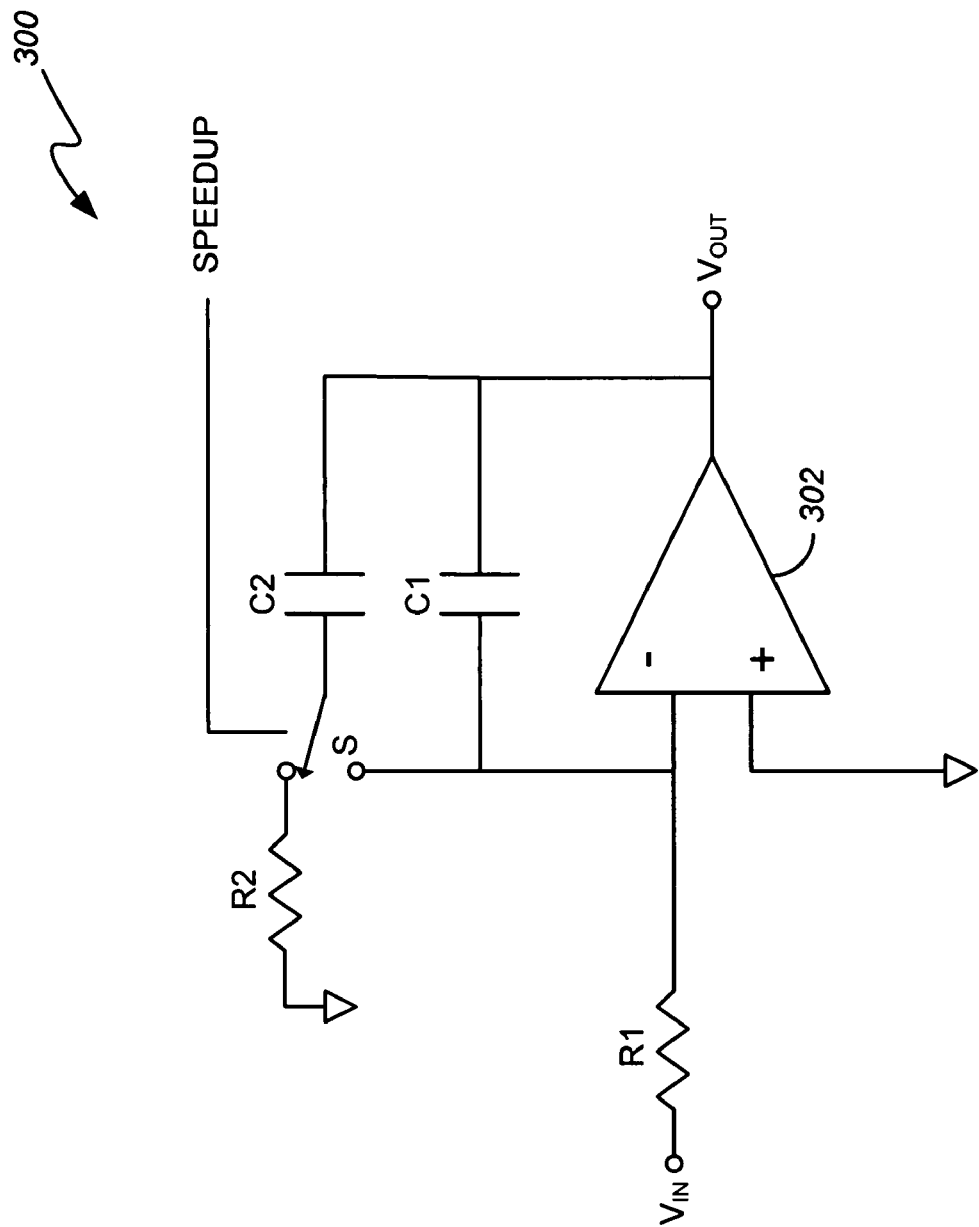
FIG. 3 illustrates an exemplary embodiment of the switchable integrators shown in FIGS. 1 & 2.

FIG. 3 illustrates an exemplary embodiment of a switchable integrator 300 which may be used for any of the switchable integrators 116, 118, 206 shown in FIGS. 1 & 2. The switchable integrator 300 comprises an operational amplifier (op-amp) 302, an input resistance $R_1$, that is coupled between the voltage input ($V_{IN}$) and the negative input of the op-amp 302, and a first feedback capacitor $C_1$ that is coupled between the signal output ($V_{OUT}$) and the negative input of the op-amp 302. The switchable integrator 300 also comprises a second feedback capacitor $C_2$ that can, via a switch S, be 1) coupled in parallel with the first feedback capacitor $C_1$, or 2) coupled between the signal output ($V_{OUT}$) and ground via an optional resistor $R_2$. The switch S is responsive to a SPEEDUP signal, such that the switchable feedback capacitor $C_1$ can be 1) coupled in parallel with capacitor $C_2$ in a narrow bandwidth mode of the switchable integrator 300, and 2) coupled to the resistor $R_2$ in a wide bandwidth mode of the switchable integrator 300.

In some cases, one or both of the feedback capacitors $C_1$ and $C_2$ may be replaced with a plurality of capacitors. For example, the fixed capacitor $C_1$ could be replaced with a plurality of fixed capacitors, or the switchable feedback capacitor $C_2$ could be replaced with a plurality of switchable feedback capacitors. If the switchable feedback capacitor $C_2$ is replaced with a plurality of switchable feedback capacitors, the switchable feedback capacitors may be switched to ground via separate or shared ground paths, and may be switched via a single or multiple switching action(s).

When in its wide bandwidth mode, the slew rate of the switchable integrator 300 is proportional to $(1/R_1 C_1)$. When slewing in wide bandwidth mode, the much larger capacitor $C_2$ charges to substantially the same voltage as capacitor $C_1$, since one end of capacitor $C_2$ is grounded (through $R_2$, if present), and one end of capacitor $C_1$ is nominally grounded as a result of the op-amp's feedback action. The voltage to which capacitor $C_2$ charges is related to V1, where V1=A*V2+B, where V2 is the voltage to which the first feedback capacitor is charged in the wide bandwidth mode, and where A and B are constants.

The op-amp 302 is preferably able to supply a current that is large enough to slew $C_2$ at the same rate that $C_1$ is slewing. After the slew, the switch S is preferably not thrown (to couple $C_2$ in parallel with $C_1$) until $C_2$ has finished settling (i.e., not for several $R_2 C_2$ time constants). Resistor $R_2$ is ideally as small as possible, being only as large as is necessary to maintain stability of the op-amp 302.

If the switchable integrator 300 is configured and operated as set forth above, the throwing of switch S to place the switchable integrator 300 in its narrow bandwidth position results in few or no output voltage perturbations or resulting settling intervals at the signal output ($V_{OUT}$).

In the case of the third switchable integrator 206 (FIG. 2), the switchable integrator 300 may be configured by coupling its positive input to the voltage reference provided via line REF.

Each of the switchable integrators 116, 118, 206 is switched between its high and low bandwidth modes in response to the state of a respective SPEEDUP control signal (e.g., SPEEDUP1, SPEEDUP2 or SPEEDUP3). When one of the switchable integrators 116, 118, 206 is in its high bandwidth mode, the bandwidth determining capacitors used in the integrator's low bandwidth mode are automatically pre-charged to the steady-state voltages they will hold in low bandwidth mode. This assures that there will be minimal voltage perturbations and consequent settling tails when the integrator's low bandwidth mode is selected.

Figure 4:
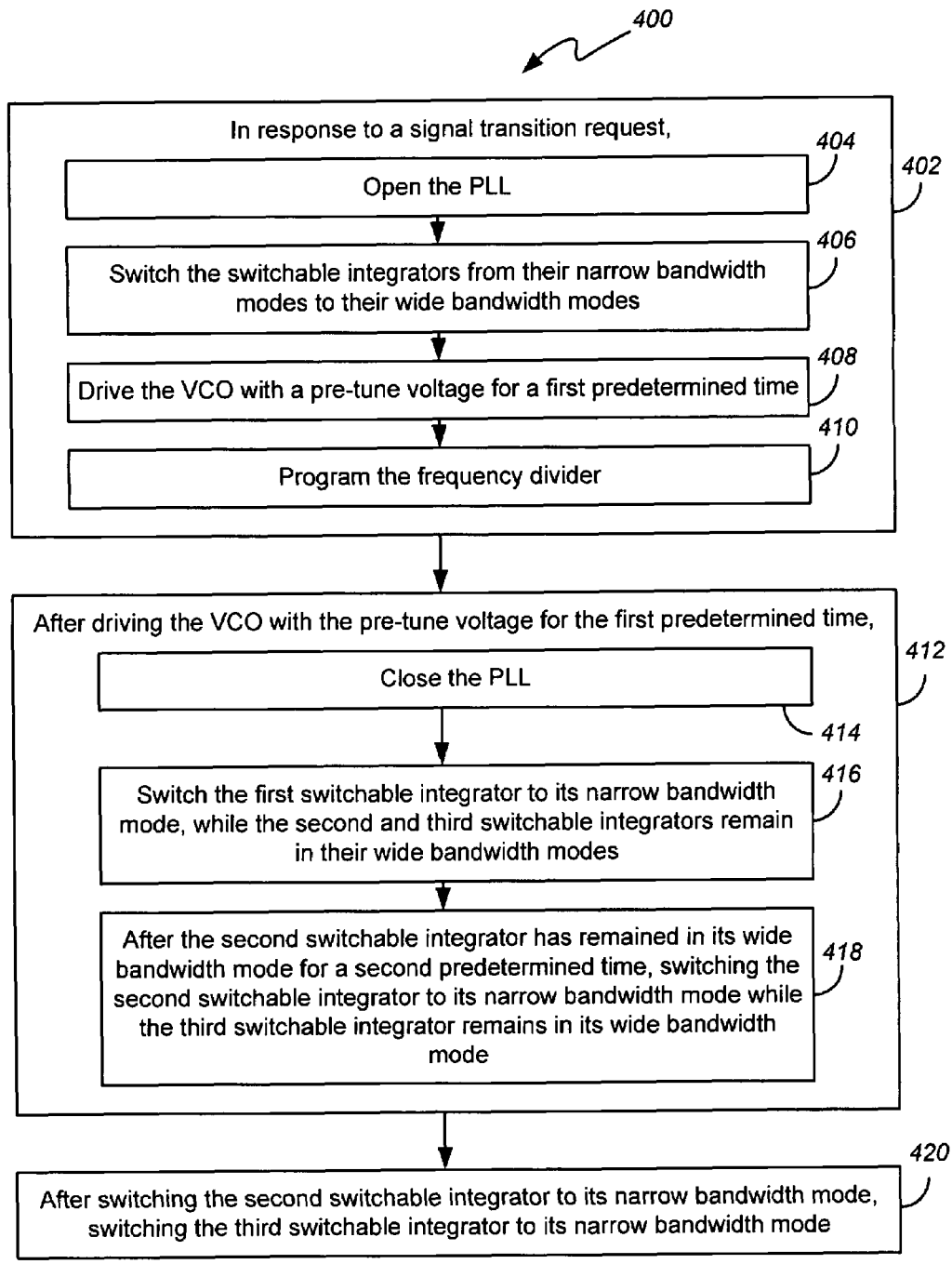
FIG. 4 illustrates an exemplary control method that may be implemented by the controller shown in FIG. 2.

A controller 120 serves to operate the various switches of the signal control system 200, including those of the switchable integrators 116, 118, 206. The controller 120 may also program the frequency divider 112 and the amplitude detector 220. FIG. 4 illustrates an exemplary control method 400 that may be implemented by the controller 120. The method 400 comprises, in response to a signal transition request (block 402), 1) opening the PLL 104 (at block 404), 2) switching the switchable integrators 116, 118, 206 from their narrow bandwidth modes to their wide bandwidth modes (at block 406), 3) driving the VCO 106 with a pre-tune voltage for a first predetermined time (at block 408), and 4) programming the frequency divider 112 (at block 410). After driving the VCO 106 with the pre-tune voltage for the first predetermined time (block 412), the method 400 1) closes the PLL 104 (at block 414), and 2) switches the first switchable integrator 116 to its narrow bandwidth mode while the second and third switchable integrators 118,206 remain in their wide bandwidth modes (at block 416). After the second switchable integrator 118 has remained in its wide bandwidth mode for a second predetermined time, the method 400 switches the second switchable integrator 118 to its narrow bandwidth mode while the third switchable integrator 206 remains in its wide bandwidth mode (at block 418). Finally, and after switching the second switchable integrator 118 to its narrow bandwidth mode, the method 400 switches the third switchable integrator 206 to its narrow bandwidth mode (at block 420). At this point, the signal control system 200 is preferably in a phase and amplitude lock, in which it remains until another signal transition request causes the method 400 to be initiated once again.

In one embodiment, the method 400 further comprises, in response to the signal transition request, 1) computing an output level correction (CORR.) for the second ALC 204, and then 2) programming the second ALC 204 to provide the output level correction. In one embodiment, the second ALC 204 may be programmed to provide the output level correction via programming of the amplitude detector 220.

In some cases, the controller 120 may configured to initiate the method 400 anytime a signal transition request is determined to be necessary. In other cases, the controller 120 may be configured to only initiate the method 400 only for signal transition requests that exceed a threshold (such as frequency transitions of more than ten megahertz (10 MHz)).

The method 400 and systems 100, 200 disclosed above are useful not only because they reduce settling delays (e.g., by means of the switchable integrators 116, 118, 206), but because they reduce programming delays. Programming delays are reduced, for example, by programming the frequency divider 112 while the PLL 104 is open, and by computing the output level correction for the second ALC 204 during pre-tune and settling of the PLL 104.

Settling and programming delays of the signal control systems 100, 200 may also be reduced by implementing at least part of the controller 120 via an FPGA 128 or other programmed circuit. As indicated, the FPGA 128 may implement a number of timers 122, 124, 208 for determining when the switchable integrators 116, 118, 206 are switched from their high bandwidth modes to their low bandwidth modes.

The reduction of settling and programming delays in the signal control systems 100, 200 enable the control systems 100, 200 to provide faster frequency, amplitude and power transitions at their signal outputs 102.

The signal control systems 100, 200 disclosed above have various applications, some of which are in radio frequency (RF) signal control systems.

What is claimed is:

1. A signal control system having a signal output, the signal control system comprising:
   a phase-locked loop (PLL) having a voltage-controlled oscillator (VCO), a phase error detector, an oscillating output coupled to the signal output of the signal control system, and a programmable frequency divider coupled in a feedback path between the oscillating output and the phase error detector;
   at least one automatic level controller (ALC) coupled to the oscillating output of the PLL;
   a plurality of switchable integrators, including first and second switchable integrators that are respectively coupled between the phase error detector and the VCO, and in the at least one ALC, wherein each of the switchable integrators is switchable between 1) a narrow bandwidth mode that provides for stable operation of the signal control system, and 2) a wide bandwidth mode that enables fast signal transitions at the signal output; and
   a controller configured to,
      in response to a signal transition request, i) open the PLL, ii) switch the switchable integrators from their narrow bandwidth modes to their wide bandwidth modes, iii) drive the VCO with a pre-tune voltage for a first predetermined time, and iv) program the frequency divider; and
      after driving the VCO with the pre-tune voltage for the first predetermined time, close the PLL and switch the first and second switchable integrators to their narrow bandwidth modes.

2. The signal control system of claim 1, wherein:
   the VCO has an amplitude control input;
   the at least one ALC comprises a first ALC coupled between the oscillating output of the VCO and the amplitude control input of the VCO; and
   the second switchable integrator is coupled in the first ALC.

3. A signal control system having a signal output, the signal control system comprising:
   a phase-locked loop (PLL) having a voltage-controlled oscillator (VCO), a phase error detector, an oscillating output coupled to the signal output of the signal control system, and a programmable frequency divider coupled in a feedback path between the oscillating output and the phase error detector, the VCO having an amplitude control input;
   at least one automatic level controller (ALC) coupled to the oscillating output of the PLL, the at least one ALC including i) a first ALC coupled between the oscillating output of the VCO and the amplitude control input of the VCO, and ii) a second ALC coupled between the oscillating output of the VCO and the signal output of the signal control system; and
   a plurality of switchable integrators, including first, second and third switchable integrators that are respectively coupled between i) the phase error detector and the VCO, ii) in the first ALC, and ii) in the second ALC, wherein each of the switchable integrators is switchable between 1) a narrow bandwidth mode that provides for stable operation of the signal control system, and 2) a wide bandwidth mode that enables fast signal transitions at the signal output.

4. The signal control system of claim 3, further comprising a controller, configured to:
in response to a signal transition request,
open the PLL;
switch the switchable integrators from their narrow bandwidth modes to their wide bandwidth modes;
drive the VCO with a pre-tune voltage for a first predetermined time; and
program the frequency divider;
after driving the VCO with the pre-tune voltage for the first predetermined time,
close the PLL; and
switch the first switchable integrator to its narrow bandwidth mode, while the second and third switchable integrators remain in their wide bandwidth modes;
after the second switchable integrator has remained in its wide bandwidth mode for a second predetermined time, switching the second switchable integrator to its narrow bandwidth mode while the third switchable integrator remains in its wide bandwidth mode; and
after switching the second switchable integrator to its narrow bandwidth mode, switching the third switchable integrator to its narrow bandwidth mode.

5. The signal control system of claim 4, wherein the controller comprises a number of timers, and wherein the controller switches the switchable integrators from their wide bandwidth modes to their narrow bandwidth modes in response to the number of timers.

6. The signal control system of claim 5, wherein functions of the controller are implemented via firmware and a field-programmable gate array (FPGA), and wherein the number of timers are implemented by the FPGA.

7. The signal control system of claim 4, wherein the controller is further configured to, in response to the signal transition request, i) compute an output level correction for the second ALC, and then ii) program the second ALC to provide the output level correction.

8. The signal control system of claim 4, wherein the signal transition request consists of signal transition requests that exceed a threshold.

9. The signal control system of claim 1, wherein the at least one ALC comprises an ALC coupled between the oscillating output of the VCO and the signal output of the signal control system.

10. The signal control system of claim 1, further comprising:
a controller configured to switch the switchable integrators between their narrow bandwidth modes and their wide bandwidth modes, the controller comprising a number of timers, and the controller switching the switchable integrators from their wide bandwidth modes to their narrow bandwidth modes in response to the number of timers.

11. The signal control system of claim 10, wherein the number of timers is implemented by a field-programmable gate array (FPGA).

12. The signal control system of claim 1, wherein the controller is further configured to:
after driving the VCO with the pre-tune voltage for the first predetermined time,
switch the first switchable integrator to its narrow bandwidth mode while the second switchable integrator remains in its wide bandwidth mode; and
after the second switchable integrator has remained in its wide bandwidth mode for a second predetermined time, switch the second switchable integrator to its narrow bandwidth mode.

13. The signal control system of claim 1, wherein the signal output is a radio frequency (RF) signal output.

14. The signal control system of claim 1, wherein each of the switchable integrators comprises at least one capacitor that is switchable into and out of the switchable integrator.

15. The signal control system of claim 1, wherein at least one of the plurality of switchable integrators comprises a plurality of feedback capacitors, wherein 1) in the narrow bandwidth mode, first and second feedback capacitors of the plurality of feedback capacitors are coupled in parallel, in a feedback path of the at least one of the plurality of switchable integrators, and 2) in the wide bandwidth mode, the first feedback capacitor is coupled in the feedback path, and the second feedback capacitor is charged to a voltage.

16. The signal control system of claim 15, wherein, when in the wide bandwidth mode, the second feedback capacitor is charged to a voltage related to V1, where $V1=A*V2+B$, where V2 is a voltage to which the first feedback capacitor is charged in the wide bandwidth mode, and where A and B are constants.

17. A method of providing fast signal transitions in an oscillating signal, comprising:
generating the oscillating signal via a phase-locked loop (PLL) having a voltage-controlled oscillator (VCO) and a programmable frequency divider;
automatically adjusting an amplitude of the oscillating output via at least one automatic level controller (ALC);
in response to a signal transition request,
opening the PLL;
switching each of a plurality of switchable integrators, including first and second switchable integrators that are respectively coupled in the PLL and the at least one ALC, from a narrow bandwidth mode to a wide bandwidth mode;
driving the VCO with a pre-tune voltage for a first predetermined time; and
programming the frequency divider;
after driving the VCO with the pre-tune voltage for the first predetermined time, closing the PLL; and
switching the first switchable integrator to its narrow bandwidth mode, while the second switchable integrator remains in its wide bandwidth mode; and
after the second switchable integrator has remained in its wide bandwidth mode for a second predetermined time, switching the second switchable integrator to its narrow bandwidth mode.

18. The method of claim 17, wherein switching each of the plurality of switchable integrators comprises switching at least one capacitor into or out of each switchable integrator.

19. The method of claim 17, further comprising, switching the switchable integrators from their high bandwidth modes to their low bandwidth modes in response to a number of timers implemented by a field-programmable gate array (FPGA).

20. The method of claim 19, wherein the at least one ALC comprises a first ALC feeding the oscillating signal of the VCO back to an amplitude control input of the VCO, and a second ALC receiving the oscillating signal of the VCO and producing an amplified oscillating signal, the first ALC having the second switchable integrator coupled therein, and the second ALC having a third switchable integrator coupled therein, the method further comprising:

in response to the a signal transition request, i) computing an output level correction for the second ALC, and then ii) programming the second ALC to provide the output level correction; and after switching the second switchable integrator to its narrow bandwidth mode, switching the third switchable integrator to its narrow bandwidth mode.

21. The method of claim 17, wherein the signal transition request consists of signal transition requests that exceed a threshold.

* * * * *

UNITED STATES PATENT AND TRADEMARK OFFICE
CERTIFICATE OF CORRECTION

| | | |
|---|---|---|
| PATENT NO. | : 7,671,690 B2 | Page 1 of 1 |
| APPLICATION NO. | : 11/897782 | |
| DATED | : March 2, 2010 | |
| INVENTOR(S) | : Paul A. Lameiro et al. | |

It is certified that error appears in the above-identified patent and that said Letters Patent is hereby corrected as shown below:

On cover page, item (73), column 1, line 1, delete "Technolgies," and insert -- Technologies, --, therefor.

Signed and Sealed this

Eighteenth Day of May, 2010

David J. Kappos
*Director of the United States Patent and Trademark Office*